(12) United States Patent
Brandel et al.

(10) Patent No.: US 10,760,755 B2
(45) Date of Patent: Sep. 1, 2020

(54) LIGHTING SYSTEM WITH A LASER LIGHT SOURCE FOR A MOTOR VEHICLE

(71) Applicant: VARROC LIGHTING SYSTEMS, S.R.O., Senov u Noveho Jicina (CZ)

(72) Inventors: Joachim Brandel, Erftstadt (DE);
Markus Klein, Bad Honnef (DE);
Tomas Kreml, Ostrava-Poruba (CZ);
Jan Kratochvil, Horka-Domky (CZ)

(73) Assignee: Varroc Lighting Systems, s.r.o., Senov u Noveho Jicina (CZ)

( * ) Notice: Subject to any disclaimer, the term of this patent is extended or adjusted under 35 U.S.C. 154(b) by 0 days.

(21) Appl. No.: 15/705,560

(22) Filed: Sep. 15, 2017

(65) Prior Publication Data

US 2018/0073697 A1    Mar. 15, 2018

(30) Foreign Application Priority Data

Sep. 15, 2016    (DE) .......................... 10 2016 117 411

(51) Int. Cl.
*F21S 41/14* (2018.01)
*F21S 45/70* (2018.01)
(Continued)

(52) U.S. Cl.
CPC .............. *F21S 41/14* (2018.01); *F21S 41/16* (2018.01); *F21S 41/176* (2018.01);
(Continued)

(58) Field of Classification Search
CPC .. F21S 41/00; F21S 41/10; F21S 41/12; F21S 41/14; F21S 41/16; F21S 41/176; F21S 41/192; F21S 41/255; F21S 41/285; F21S 43/00; F21S 43/13; F21S 43/16; F21S 43/19; F21S 43/195; F21S 43/315; F21S 45/00; F21S 45/10; F21S 45/70;
(Continued)

(56) References Cited

U.S. PATENT DOCUMENTS 9,360,184 B2 * 6/2016 Schimon .............. B60Q 1/0041
10,174,897 B2 * 1/2019 Atoji ........................ B60Q 1/04
(Continued)

FOREIGN PATENT DOCUMENTS

DE    102012220476    12/2013
DE    102012220472    5/2014
(Continued)

*Primary Examiner* — Thien M Le
*Assistant Examiner* — April A Taylor
(74) *Attorney, Agent, or Firm* — Ursula B. Day (57) ABSTRACT

A lighting system for automobiles is proposed which includes a laser light source emitting a primary laser light bundle within a solid angle area around a beam direction, a photoluminescence element positioned within the emitted primary light beam, and a protective element that protects against stray laser rays. The photoluminescence element is configured to absorb the laser rays impinging on said element and by means of the photoluminescence to radiate secondary light rays. The lighting system includes a protection system with a protective element of an elongated shape having a first end and a second end, wherein the first end of the protective element is positioned within the beam direction of the primary light beam and downstream of the photoluminescence element.

16 Claims, 3 Drawing Sheets

(51) Int. Cl.
*F21S 41/16* (2018.01)
*H01S 5/00* (2006.01)
*H01S 5/068* (2006.01)
*F21S 41/176* (2018.01)
*H01S 5/024* (2006.01)
*F21S 41/19* (2018.01)
*F21V 29/51* (2015.01)
*F21S 41/25* (2018.01)
*F21S 45/47* (2018.01)
*F21S 41/20* (2018.01)
*F21V 25/04* (2006.01)
*F21V 25/10* (2006.01)

(52) U.S. Cl.
CPC ............. *F21S 41/192* (2018.01); *F21S 41/25* (2018.01); *F21S 41/285* (2018.01); *F21S 45/47* (2018.01); *F21S 45/70* (2018.01); *F21V 25/04* (2013.01); *F21V 25/10* (2013.01); *F21V 29/51* (2015.01); *H01S 5/00* (2013.01); *H01S 5/02438* (2013.01); *H01S 5/06825* (2013.01); *H01S 5/005* (2013.01)

(58) Field of Classification Search
CPC .......... F21V 25/00; F21V 25/02; F21V 25/04; F21V 25/10; H01S 5/005
See application file for complete search history.

(56) References Cited

U.S. PATENT DOCUMENTS

| | | | |
|---|---|---|---|
| 10,228,106 B2* | 3/2019 | Hager | F21S 41/322 |
| 2015/0043233 A1* | 2/2015 | Bauer | B60Q 11/00 |
| | | | 362/510 |
| 2015/0062953 A1 | 3/2015 | Woelfing et al. | |
| 2016/0305626 A1* | 10/2016 | Tatara | F21S 41/14 |
| 2017/0324214 A1* | 11/2017 | Renaud | B60Q 1/0408 |
| 2017/0328532 A1* | 11/2017 | Edlinger | F21S 41/135 |

FOREIGN PATENT DOCUMENTS

| | | |
|---|---|---|
| DE | 102015221399 | 5/2017 |
| JP | 2014-22084 | 2/2014 |
| WO | WO 2013/139675 | 9/2013 |
| WO | WO 2016/110919 | 7/2016 |

* cited by examiner

Fig. 2C

LIGHTING SYSTEM WITH A LASER LIGHT SOURCE FOR A MOTOR VEHICLE

CROSS-REFERENCES TO RELATED APPLICATIONS

This application claims the priority of German Patent Application Serial No. 10 2016 117 411.4 filed Sep. 15, 2016 pursuant to 35 U.S.C. 119(a)-(d), the subject matter of which is incorporated herein by reference.

BACKGROUND OF THE INVENTION

The present invention relates to a lighting system for a motor vehicle. The system includes a laser light source for emitting a primary light beam of laser beams within a solid angle region around a beam direction, an element for photoluminescence, an optical element to convert the light beams of a secondary light into an emission light distribution; and a protective device to protect against laser rays leaking from the system. The element for photoluminescence is disposed within the primary light beam emitted from the laser light source and configured to absorb and scatter the laser beams impinging on the element and to emit a secondary light by means of photoluminescence and scattering.

Lighting arrangements for a motor vehicle lighting system of the prior art are provided with at least one laser light source. Since laser light sources, at high radiation intensities have a small surface emitting light and in essence radiate a collimated light beam, laser light operated optical systems having a small focal length can be configured for heavily bundled beams. Such systems thus require a small space and/or produce a more heavily collimated light beam.

Conventional laser light sources emit monochromatic light or light of a very limited wave length range, for example blue light. However, a motor vehicle headlight should emit mixed white light. For that, the blue light is to be converted into white light, wherein conversion of blue light of the laser light source into while mixed light uses phosphorescent substances or luminescent material. The combination of ceramic material and phosphorescent substances are termed photo luminescent converters. The photo luminescent converters include mostly a photo luminescent dye which is excited by the blue light from the laser source.

The photo luminescent dye emits light which differs in wave length from blue light, so that a portion of the irradiated light of a wave length range is converted into light of another wave length range. A further portion of the irradiated light is scatted by the photo luminescent converter. The scattered light and the light radiating by photo luminescence are superposed and lead for example to the desired white mixed light, which corresponds to the secondary light.

The coherent and heavily collimated light emitted from the laser source can be dangerous for the human eye, in particular at high radiation intensities. In motor vehicles, the laser sources should comply with certain security regulation; for example the intensity of light emitted from the headlight of a motor vehicle has to have a limit value to avoid blinding other drivers. These security requirements must be followed, especially when the headlights, due to the mechanical impact of an accident have been damaged, bent or moved from its original position or have been improperly mounted.

When using photo luminescence conversion in a motor vehicle headlight having a laser light source, photo luminescence conversion takes over security functions. Upon positional change or destruction of the converter heavily focused dangerous laser rays can be emitted from the headlight which is dangerous to the human eye, so that such emission should be avoided.

From DE 10 2010 220 476 A1, a lighting device for motor vehicle is known having a laser light source for emitting a primary light beam and a photo luminescence element. The photo luminescence element is disposed in such a way that the primary light beam emitted from the laser light source impinge on the photo luminescence element such that by exploiting photoluminescence by the impinging primary light beam a secondary light distribution is emitted. Present is also a temperature measuring apparatus to determine the temperature of the photoluminescence element and to monitor the normal operation of the lighting device.

The prior art also includes lighting systems for motor vehicles with a laser light source that include photo sensors to determine the composition of the emitted light. For example, it is possible to distinguish blue light from white mixed light and also a faulty functioning of the device, in particular, with respect to the photoluminescence converter.

WO 2014/072227 also describes a motor vehicle lighting device with a laser light source for radiating a primary light beam in a primary solid angle range around a primary radiation direction. The lighting device includes a photo luminescence element arranged in such a way that the primary light beam from the laser light source impinges on the photo luminescence element. The photo luminescence element is configured such that by exploiting photo luminescence by the impinging primary light beam, a secondary light distribution, especially polychromatic or white light is emitted. In addition, a radiation optical device can transform the secondary light distribution into a radiation light distribution of the lighting device. The lighting device includes a radiation suspension means in order to inhibit the transformation of light beams into the radiation light distribution, which, starting from the laser light source in the solid angle range, extends around the primary radiation direction.

One aspect of the present invention is to provide a lighting system for a motor vehicle with a laser light source where emission of heavily focused laser beams that are dangerous to the human eye, is prevented. The device should be a simple construction with a minimal amount of components at minimal space requirement. In addition, the cost of production, the maintenance and the installation should likewise be at a minimal level.

It would therefore be desirable and advantageous to provide an improved lighting system for motor vehicles to obviate prior art shortcomings and to reduce danger to the human eye that happens at high radiation intensities from laser light.

SUMMARY OF THE INVENTION

The present invention resolves prior art problems by a lighting system for motor vehicles that includes a laser light source for emitting a primary light bundle of laser beams within a solid angle area around a beam direction, a photoluminescence element positioned within the primary light beams emitted from the laser light source and configured to absorb and scatter the laser beams impinging on the photoluminescence element; by means of photo luminescence and light scattering, light beams of a secondary light are radiated from the photoluminescence element. A protective device is provided to protect against laser beams radiating from the system; wherein the protective device includes a protective element of an elongated shape with a first end and a second end, wherein the first end of the protective element is positioned within a beam direction of the primary light beam and downstream of the photoluminescence element.

According to one aspect of the present invention, a lighting system is provided which includes a laser light source to radiate a primary light bundle of laser beams within a solid angle area around a laser beam direction, an element for photoluminescence and at least one protective device for protecting against laser rays that leak from the system.

The photoluminescence element is positioned within the primary light beam emitted from the laser light source and configured such that the laser beams impinge on the photoluminescence element where they are absorbed and scattered and then emit beams of secondary light due to photoluminescence and scattering. Secondary light is a mixture of light, in particular, a white light mixture which is to be understood as light radiated through photoluminescence and scattered light that are superposed.

According to a further aspect of the present invention, the protective device includes a protective element of elongate shape with a first end and a second end. The first end of the protective element is upright and oriented within the beam of the primary light beam in beam direction and downstream of the photoluminescence element.

According to a further embodiment of the present invention, the system includes an optical element to transform the light beams of the secondary light into an emission light distribution.

According to an alternative embodiment of the present invention, the first end of the protective element is positioned in direction of the primary light beam downstream of the optical element. In a further alternative embodiment, the first end of the protective element is positioned in direction of the primary light beam between the photoluminescence element and the optical element.

In another alternative embodiment of the present invention, the protective element is positioned in the area of the first end and distanced to the first end or is positioned contacting the optical element.

According to first alternative embodiment, the protective element is shaped as a narrow strip. The elongated protective element can be also configured in different shapes such as for example a trapezoidal or triangular shape.

Preferably, the protective element is of metal and formed as a metal strip. For example, the protective element can be a flat rolling mill ready made product, similar to a sheet metal strip with a minimal height or a minimal thickness and with a width larger in relation to the thickness and a substantially lager length relative to the width. Advantageously, the protective element is L-shaped.

A preferred embodiment of the present invention provides that the protective system is configured as a flexible circuit board and connected with the protective element of the system. To this end, the circuit board is advantageously arranged at the side of the protective element, in particular the strip-shaped protective element on which the laser rays of the primary light beam or the light rays of the secondary impinge in beam direction.

According to another aspect of the present invention, the protective system includes at least one sensor. The sensor is arranged at the first end of the protective element in beam direction of the primary light beam in front of the protective element and within the solid angle area of the laser rays of the primary light beam of the laser light source. The sensor is connected to the circuit board in a preferably mechanical or electrical manner.

According to the present invention, the sensor of the protective device is configured as a temperature sensor or/and a photo sensor. The photo sensor preferably is provided with an auxiliary filter element.

According to a second alternative embodiment of the protective element of the present invention, the protective element is configured as a heat pipe having a temperature sensor. The temperature sensor is arranged at the second end of the heat pipe. The sensors are preferably constructed and coupled to a control drive, so as to recognize a malfunction of the system and to turn off the laser light source.

In a further advantageous embodiment of the present invention, a photo sensor is provided that is positioned in a direction of the light of the primary light beam of the laser light and also in the direction that deviates from the main beam direction of the light from the secondary light. The photo sensor is preferably mechanically or electrically connected to the circuit board.

The optical element of the present invention is further developed into a lens with an optical device for deflecting at least a portion of the light rays of the secondary light in direction of the photo sensor. The optical device is advantageously configured as a deflection element that is in particular, a deflection prism.

A further preferred embodiment of the present invention resides in the protective element being mechanically connected to the optical element especially by means of a connector. The protective element is advantageously fixed at the optical element via a mechanical connector that is configured as a screw connector.

In accordance with a further advantageous embodiment of the present invention, the system includes a heat sink constructed as a cooling element, in particular a ribbed cooling element that is mechanically and thermally coupled to the optical element and the laser light source as well as to the protective element. The connection of the protective element is especially in the area of the second end oriented distally to the first end.

The circuit board is preferably also mechanically and thermally coupled to the heat sink. Advantageously, the circuit board is arranged and electrically coupled to the circuit board.

The lighting system of the present invention for a motor vehicle has the following summarized advantages:

preventing strongly focused laser beams that are dangerous to the human eye by means of absorption or change of beam direction and/or by switching off the system, simple construction and production by using a minimal number of components with minimal use of space, and minimal cost for production, mounting and operation.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the Figures, same or corresponding elements are generally indicated by same reference numerals.

Figure 1A:
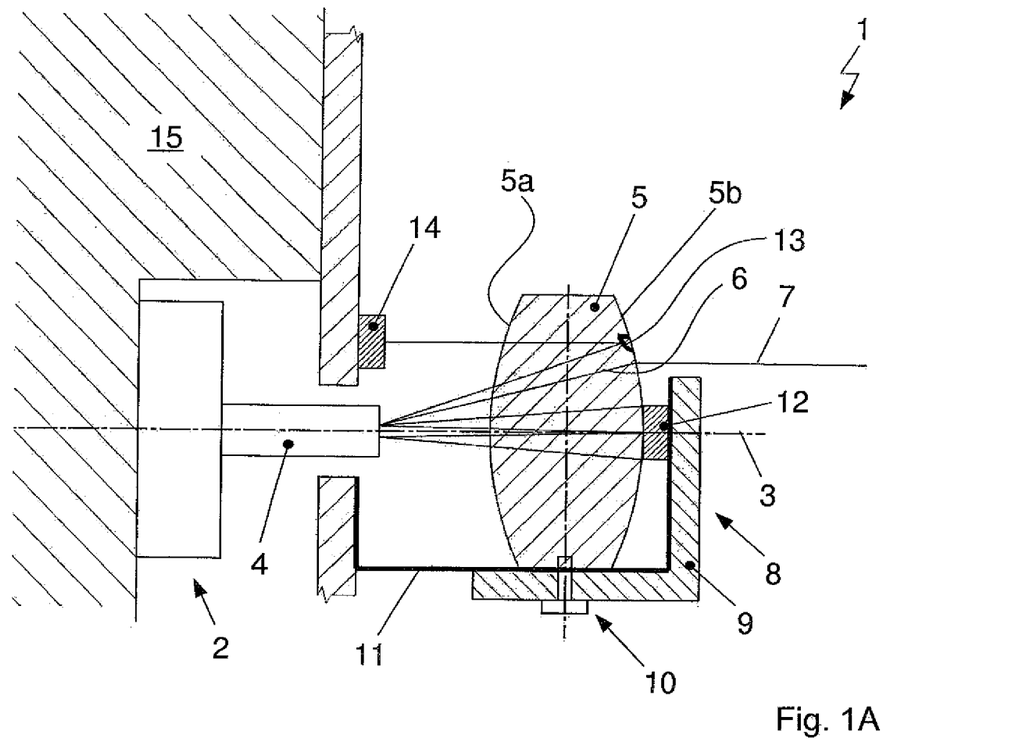
FIG. 1A is a section cut of a side view illustration of a lighting system according to the present invention, showing a laser light source, a protective device and an optical element as well as a mechanical protection element, a circuit board and sensors with indicates light beams of different wave length, wherein a sensor is adjacent the optical element.

Turning now to the drawing, and in particular to FIG. 1A, there is shown a lighting system 1 for a motor vehicle with at least one laser light source 2, at least one protective device 8 and an optical element 5. Protective device 8 has mechanical protection element 9, a circuit board 11 and sensors 12, 14 shown in a section cut with the indicated light rays 6 of different wave length.

Figure 1B:
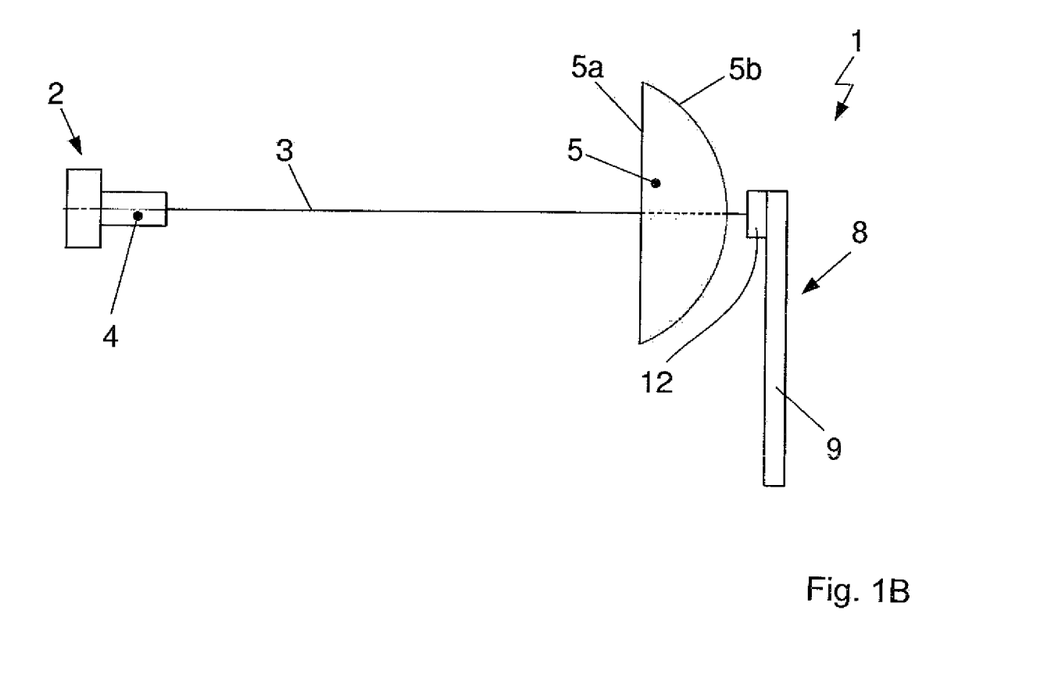
FIG. 1B is a side view of a schematic illustration of a lighting system according to the present invention, showing a laser light source, a protective device and an optical element as well as a mechanical protection element with a sensor, wherein a sensor is positioned at a distance from the optical element.

According to embodiment in FIG. 1A, a sensor 12 is arranged adjacent the optical element 5. FIG. 1B shows an alternative embodiment according to FIG. 1A. As compared to the embodiment according to FIG. 1A, the sensor 12 of arranged at a distance to optical element 5.

The laser light source 2 emits essentially blue light of a primary light beam and a beam direction 3. The laser light is thereby emitted in a certain area around the beam direction 3 of laser light source 2. The area around the beam direction is defined as the solid angle area of the primary light beam.

The primary light beam 2 impinges on an photoluminescence element 4 and converted into the white light of a secondary light 6 with the aid of photoluminescence element 4 or by light scattering. As a result, upon proper operation, the laser module formed by the laser source 2 and photoluminescence element 4 emits white light as a secondary light 6. The laser light of light source 2, upon proper operation of system 1 is being absorbed by element 4 for photoluminescence, reflected or scattered, so that no strongly focused laser beams are leaking from system 1 that are dangerous to the human eye.

The secondary light 6 emitted from the laser module is lead to an optical element 5 configured as a lens and after penetrating lens 5 is transformed into an emission light distribution 7. The entry surface 5a and exit surface 5b of Lens 5 represent two light transmission surfaces 5a and 5b for light beams of the secondary light 6. The light beams of the emission light distribution 7, after exiting the exit surface 5b extend for example substantially parallel to a main radiation direction of system 1, which at embodiment according to FIG. 1A corresponds to radiation direction 3 of the primary light beam.

System 1 includes also a protection device 8, which protects from laser light, especially light radiating from the laser module of system 1. Laser light dangerous to the human eye, for example, leaks from system 1 when through mechanical impact of an accident lighting system 1 is destroyed, deformed or changed from its original position.

Protective device 8 is configured as a mechanical protective element 9 in the shape of a narrow strip. A first end of the protective element 9 is positioned at the exit surface 5b of lens 5 in the direction 3 of the primary light beam. According to an alternative embodiment according to FIG. 1B, the end of the protective element 9 is disposed distanced from the exit surface 5b of lens 5.

The strip-shaped protective element 9, at the end that is oriented in the direction of the exit surface 5b of lens 5, has a width that corresponds at least to the width of the primary light beam at that site. In case of a positional change or even destruction of photoluminescence element 4, the laser beams of the primary light beam that radiate at a certain solid angle area from the laser module are being entirely absorbed or reflected by protective element 9. A large portion of blue laser light of the primary light beam emitted from the laser module in beam direction 3 is suppressed. The laser beams of the primary light beam are blocked by the protective element 9. In this manner, any emission of laser beams from system 1 is thus prevented while the laser module operation is protected. In case of damage to system 1, photoluminescence element 4 is positioned such that the beam path of the primary light is not or at least not entirely obstructed.

Protective element 9 for preventing the leakage of laser beams of laser light source 2 is formed from an L-shaped metal strip and a flexible circuit board 11. The circuit board 11 is mounted at the front of the metal strip. Front is to be understood as the side at which the laser beams of the light beams impinge on the metal strip. The protective element 9 is connected to the optical element 5 by means of a mechanical connection element 10, wherein the L-shaped metal strip is screwed together via a mechanical connector element 10 configured as a screw connector 10.

A temperature sensor 12 is positioned in beam direction 3 of the primary light beam between the exit surface 5b and the lens 5 and the metal strip. The temperature sensor 12 positioned within the determined solid angle area of the emitted laser beams of the primary light beam of laser light source 2, is connected with the circuit board 11. In proper operation of system 1 the temperature sensor 12 is exposed to the white light, wherein depending on the ambient temperature a certain temperature is detected.

In case of damage to system 1, such that the laser module emits laser beams, temperature sensor 12 is exposed to the blue laser beams of the laser light source 2 and thus exposed directly to the radiant power of the laser light source 2 leading to a large temperature increase detected by the temperature sensor 12. Change in temperature measured with sensor 12 or a predetermined temperature limit is used for switching off the laser light source 2 to end the operation of the laser module and system 1.

System 1 also includes a photo sensor 14, as a light sensitive sensor, that is connected to the circuit board 11 and positioned in the beam direction 3 of the primary light beam and also in a direction deviating from the main beam direction of the light of system 1. Optionally, the photo sensor 14 is provided with a supplemental filter element. It is also possible to arrange the photo sensor 14 on a separate circuit board for mechanical, thermal and electrical connection with the circuit board 11. The circuit board that includes the photo sensor 14 is in mechanically and thermally coupled to the heat sink 15.

The optical element 5 that is configured as a lens at the exit surface 5b for the light beams is provided with an optical device 13, in particular, a deflection element respectively a scattering element. The deflection element configured as a deflection prism serves to deflect at least a portion of light in direction of the photo sensor 14. The optical device 13, as compared to the temperature sensor 12, is disposed outside of the determined solid angle area of the laser light of the primary light beam that radiates in case of an accident or damage to system 1 from the laser module of laser light source 2.

By means of the optical device 13 which is configured as a deflection prism and positioned in the area of the exit surface 5*b* of lens 5, a very small amount of the white light of the emission light distribution 7 is deflected to the photo sensor 14 disposed at the circuit board 11. The photo sensor 14 measures the light intensity and the color composition of the impinging light beams.

The optical element 5 does not serve directly as protection against the blue laser beams emitted from the lens 5 in beam direction 3 of the primary light beam of laser light source 2, but serves to deflect the white light of emission light distribution 7. In proper operation of system 1 the photo sensor 14 is exposed to the beams of the white light.

In case the system 1 is disrupted or damaged, where the laser module emits laser beams, the photo sensor 14 will detect an increase of blue laser beams but, at the very least detects a decrease of white or yellow light beams within the color composition of the impinging light beams. The photo sensor 14 detects in addition to the change of color composition, a change of the light intensity, which is used in order to turn off the laser light source 2 and thus terminates the operation of the laser module and the system 1.

The temperature sensor 12 and the photo sensor 14 each are independently Used to detect a malfunction of system 1 and the switching off of the laser light source 2.

System 1 includes also a heat sink 15 which is configured as a cooling element, in particular a ribbed cooling element, which is mechanically and thermally coupled to optical element 5 as well as to laser light source 2 and circuit board 11. The heat sink 15 supports each of the components and dissipates the heat emitted from the components.

Circuit board 11 has flexible construction and is at least partially connected with the L-shaped metal strip formed as an aluminum support element as a mechanical protective element 9 of protective device 8. The mechanical protective element 9 is coupled to the cooling element in the area of the second end oriented distally to the first end. The aluminum support elements have a reinforcement in the coupling area with the cooling element.

The beam direction 3 of the primary light beam of laser light source 2 is to be understood as a primary radiation axis. The laser light source 2 radiates the primary light beam in the solid angle area of the primary light beam around the primary radiation axis. The protective device principally prevents the emission of laser beams or light beams into the solid angle area of the primary light beam around the primary radiation axis.

During normal operation, the protective device 8 has hardly an effect on the emission light distribution 7 of the light beams and is negligible. The protective device 8, especially the metal strips of mechanical protection element 9 are only stretched such that during damage, the collimated laser light of the primary light beam is being suppressed. During normal operation, the less collimated and more diffuse light beams of the emission light distribution 7 are essentially bypassing the protective element 9. The absorption of the portion of the light beams impinging on the protective element 9 in the solid angle area of the primary light beam around the primary radiation axis, leads to only a negligible loss of power or a marginal disruption of the emission light distribution.

The optical element 5 can also include a combination of projection lens and reflector or a combination of several projection lenses and several reflectors.

System 1 includes also a control to drive the laser light source 2. The control serves in particular to switch on and switch off the laser light source 2 dependent on certain signals given from the temperature sensor 12 and/or the photo sensor 14. The control, the laser light source 2, the temperature sensor 14 are coupled to each other via signal lines.

Figure 2A:
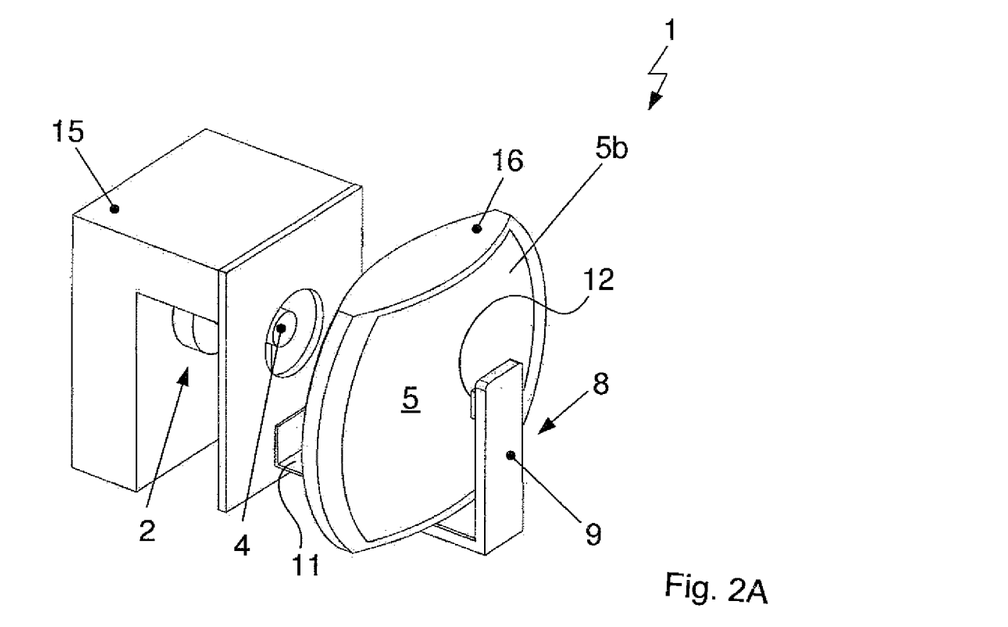
FIG. 2A, 2B is a top and left side and respectively a bottom and left side perspective view of a lighting system with a laser light source, a protective device and an optical element as well as a casing for use in a motor vehicle and a heat sink.
Figure 2B:
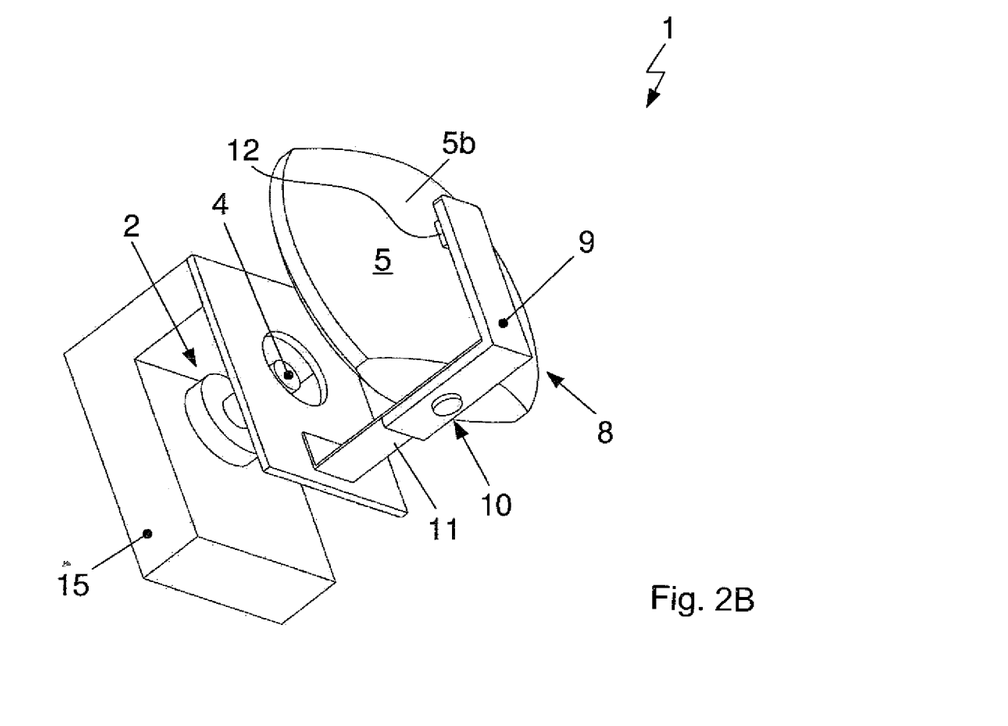
Figure 2C:
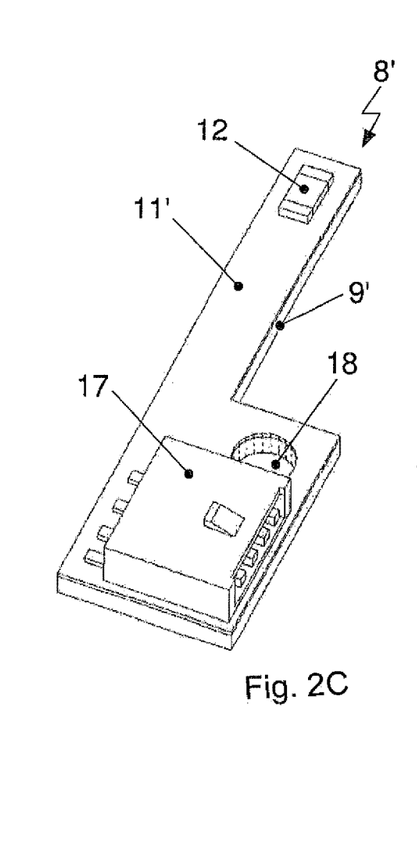
FIG. 2C is top and right side perspective detail view of components to protect from laser light emitted from the laser light source.

FIG. 2C shows the protective device 8' as a mechanical protective element 9' in the shape of a narrow strip, in particular a metal strip. The flexible circuit board 11' is disposed at the protective element 9', at the front of the metal strip. In the area of opening 18, protective element 9' is mechanically coupled to the optical element by a mechanical connector (not shown here).

Disposed at a first end of the circuit board 11' is sensor 12, the temperature sensor. At a second end distal of the first end, the circuit board 11' includes, an electrical connector 17 for connecting the circuit board 11' to system 1. Circuit board 11' and sensor 12 are then coupled to the system 1 by means of a plug connector 17. As a result, signals received from sensor 12 are transferable to system 1 via circuit board 11'.

Figure 3A:
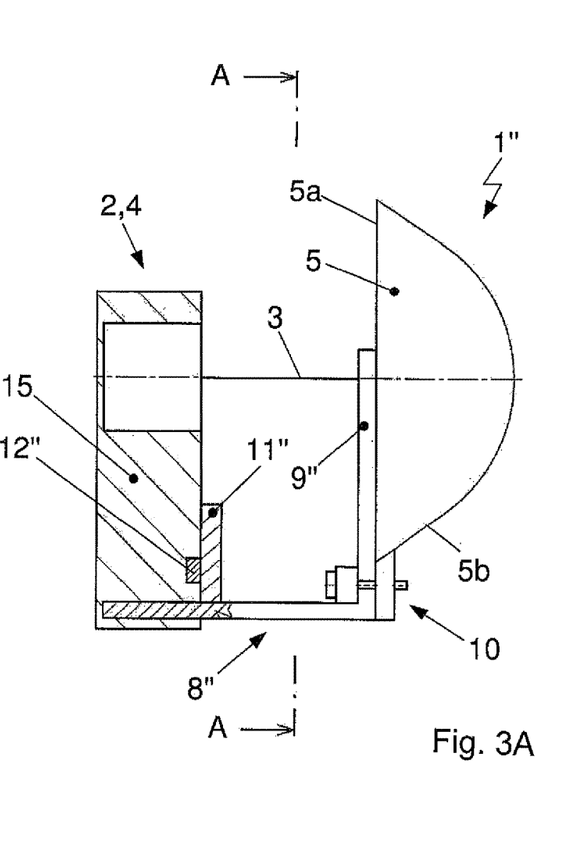
FIG. 3A is a side view of a lighting system with a laser light source, a protective device and an optical element, as well as a protective element configured as a heat pipe.
Figure 3B:
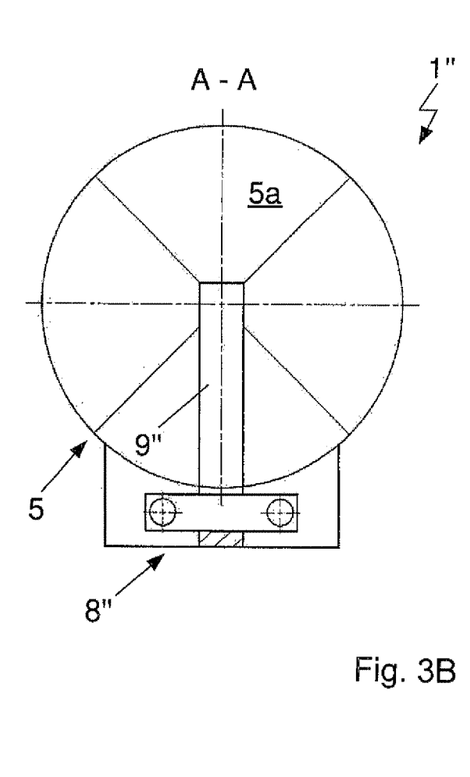
FIG. 3B is a front view of a lighting system according to FIG. 3A.

FIGS. 3A and 3B each show a lighting system 1" for a motor vehicle with at least one laser light source 2, at least a protective device 8" with a circuit board 11" and an optical element 5. The protective element 9" is configured as a heat pipe which is coupled to temperature sensor 12". FIG. 3A shows system 1" in a side view. FIG. 3B shows system 1" as a front view.

The heat pipe" in combination with the temperature sensor 1" serves as an optical safety for the laser beam not to radiate from system 1". During disturbance or damage, when laser beams are emitted from the laser module, the laser beams impinge first on the first end of the heat pipe 9". Heat pipe 9" is thus exposed directly to the radiant power of laser light source 2 and absorbs the laser radiation of laser light source 2, which increases the performance of the heat pipe. The increase in performance leads almost simultaneously to a rise in the temperature at the second end of the heat pipe, that is, without any appreciable temporal delay. The change, in particular the rise in temperature is registered by the temperature sensor 12" disposed at the second end of the heat pipe and connected to the circuit board 11". Disposing the temperature sensor 12" within a recess in the heat sink 15 leads also to a shortening of the reaction time.

The change of temperature or a temperature limit value measured by the temperature sensor 12" not directly exposed to the blue light of the laser light source 2, are used to switch off the laser light source 2 and thus the operation of the laser module and system 1".

Heat pipe 9" represents also a mechanically stable protective element which avoids the presence of sensitive electronic components within the blue light of the primary light beam from the laser light source emitted in beam direction 3. A light beam impinging the heat pipe 9" does no penetrate the heat pipe 9", but is diffusely reflected, or at least scattered in such a way that transformation of the primary light beam into the emission light distribution of system 1 is eliminated.

The heat pipe 9" with its first end is disposed adjacent and in contact with the light penetration surface 5*a* serving as entry surface for the light beams of the secondary light. According to an alternative embodiment, not shown here, the heat pipe 9", with its first end is disposed distanced from the laser module, that is, in particular, the element 4 for photoluminescence and the entry surface 5a of lens 5. The heat pipe 9" is also connected to the optical element 5 by means of a mechanical connector 10, which is a screw connector.

While the invention has been illustrated and described as embodied in lighting system with a laser light source for motor vehicles, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A lighting system for motor vehicles comprising,
   a laser light source for emitting a primary light beam of laser beams within a solid angle area around a beam direction,
   a photoluminescence element, said element positioned within the primary light beam emitted from the laser light source and configured to absorb and scatter the laser beams impinging on the photoluminescence element, wherein by means of photo luminescence and light scattering light beams of a secondary light are radiated from the photoluminescence element, and
   at least one protective device to protect against laser beams radiating from the system; wherein the protective device includes a protective element of an elongated shape in the form of a strip with a first end and a second end, wherein the first end of the protective element is positioned within a beam direction of the primary light beam and downstream of the photoluminescence element, and wherein a sensor configured as a temperature sensor is arranged at the first end upstream of the protective device and within the solid angle area of the laser beams of the primary light beam.

2. The lighting system of claim 1, further comprising an optical element configured for transforming the light beams of the secondary light into emission light distribution.

3. A lighting system for motor vehicles comprising,
   a laser light source for emitting a primary light beam of laser beams within a solid angle area around a beam direction,
   a photoluminescence element, said element positioned within the primary light beam emitted from the laser light source and configured to absorb and scatter the laser beams impinging on the photoluminescence element, wherein by means of photo luminescence and light scattering light beams of a secondary light are radiated from the photoluminescence element, and
   at least one protective device to protect against laser beams radiating from the system; wherein the protective device includes a protective element of an elongated shape with a first end and a second end, wherein the first end of the protective element is positioned within a beam direction of the primary light beam and downstream of the photoluminescence element, wherein the protective device is provided with a flexible circuit board and connected to the protective element.

4. The lighting system of claim 3, wherein the first end of the protective element is arranged positioned in the beam direction of the primary light beam downstream of an optical element or, positioned between the photoluminescence and the optical element.

5. The lighting system of claim 3, wherein the protective element is positioned in the area of the first end and distanced from an optical element or is positioned in contact with the optical element.

6. The lighting system of claim 3, wherein the protective element is constructed in the shape of a strip.

7. The lighting system of claim 3, further comprising an optical element configured for transforming the light beams of the secondary light into emission light distribution.

8. The lighting system of claim 3, wherein the protective element is positioned In the area of the first end and distanced from an optical element or is positioned in contact with the optical element.

9. The lighting system of claim 3, wherein a photo sensor is connected to the flexible circuit board.

10. The lighting system of claim 3, further comprising at least one sensor, wherein the at least one sensor is a temperature sensor arranged at the first end of the protective element in the beam direction of the primary light beam and upstream of the protective element and within the solid angle range of the laser beam of the primary light beam of the laser light source.

11. The lighting system of claim 10, wherein the at least one sensor is positioned in the beam direction of the primary light beam of the laser light as well as in a direction that deviates from a main beam direction of the light beams of the secondary light.

12. A lighting system for motor vehicles comprising,
    a laser light source for emitting a primary light beam of laser beams within a solid angle area around a beam direction,
    a photoluminescence element, said element positioned within the primary light beam emitted from the laser light source and configured to absorb and scatter the laser beams impinging on the photoluminescence element, wherein by means of photo luminescence and light scattering light beams of a secondary light are radiated from the photoluminescence element, and
    at least one protective device to protect against laser beams radiating from the system: wherein the protective device includes a protective element of an elongated shape with a first end and a second end, wherein the first end of the protective element is positioned within a beam direction of the primary light beam and downstream of the photoluminescence element, wherein the protective element is configured as a heating pipe having a temperature sensor, wherein the temperature sensor is arranged at the second end of the protective element.

13. The lighting system of claim 12, wherein an optical element is configured as a lens with at least one optical device to deflect at least a portion of the light rays of the secondary light emitted in direction of a photo sensor.

14. The lighting system of claim 12, wherein the first end of the protective element is arranged positioned in the beam direction of the primary light beam downstream of an optical element or, positioned between the photoluminescence and the optical element.

15. The lighting system of claim 12, wherein the protective element is constructed hi the shape of a strip.

16. The lighting system of claim 12, further comprising an optical element configured for transforming the light beams of the secondary light into emission light distribution.

* * * * *